(12) United States Patent
Lin et al.

(10) Patent No.: US 10,950,524 B2
(45) Date of Patent: *Mar. 16, 2021

(54) HETEROJUNCTION SEMICONDUCTOR DEVICE FOR REDUCING PARASITIC CAPACITANCE

(71) Applicant: DELTA ELECTRONICS, INC., Taoyuan (TW)

(72) Inventors: Li-Fan Lin, Taoyuan (TW); Chun-Chieh Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,115

(22) Filed: Dec. 27, 2018

(65) Prior Publication Data
US 2019/0131214 A1    May 2, 2019

Related U.S. Application Data

(60) Division of application No. 15/429,184, filed on Feb. 10, 2017, now Pat. No. 10,236,236, which is a
(Continued)

(30) Foreign Application Priority Data

Sep. 10, 2013  (TW) ................................. 10213251.2
Feb. 27, 2014  (TW) ................................. 10310665.9
Apr. 21, 2014  (TW) ................................. 10311434.0

(51) Int. Cl.
  *H01L 29/778*    (2006.01)
  *H01L 23/482*    (2006.01)
(Continued)

(52) U.S. Cl.
  CPC ........ *H01L 23/4824* (2013.01); *H01L 23/485* (2013.01); *H01L 23/528* (2013.01);
(Continued)

(58) Field of Classification Search
  CPC ............. H01L 27/0883; H01L 27/0605; H01L 23/49541; H01L 23/49562; H01L 23/49575; H01L 29/20; H01L 29/404
(Continued)

(56) References Cited

U.S. PATENT DOCUMENTS 7,072,161 B2    7/2006  Chen
7,800,131 B2    9/2010  Miyamoto et al.
(Continued)

FOREIGN PATENT DOCUMENTS

CN        1321340 A    11/2001
CN      102544002 A    7/2012
(Continued)

*Primary Examiner* — Matthew E. Gordon
(74) *Attorney, Agent, or Firm* — CKC & Partners Co., LLC

(57) ABSTRACT

A semiconductor device includes an active layer, a source electrode, a drain electrode, a gate electrode, a first insulating layer, a first source pad, and a first drain pad. The source electrode, the drain electrode, and the gate electrode are disposed on an active region of the active layer. The first insulating layer is disposed on the source electrode, the drain electrode, and the gate electrode. The first source pad and the first drain pad are disposed on the first insulating layer and the active region. The first source pad includes a first source body and a first source branch. The first source branch is electrically connected to the first source body and disposed on the source electrode. The first drain pad includes a first drain body and a first drain branch. The first drain branch is electrically connected to the first drain body and disposed on the drain electrode.

17 Claims, 15 Drawing Sheets

Related U.S. Application Data continuation-in-part of application No. 15/297,123, filed on Oct. 18, 2016, now Pat. No. 10,084,076, which is a continuation of application No. 14/496,471, filed on Sep. 25, 2014, now Pat. No. 9,508,843, which is a continuation-in-part of application No. 14/185,322, filed on Feb. 20, 2014, now Pat. No. 8,957,493.

(51) Int. Cl.

| | | |
|---|---|---|
| *H01L 23/485* | (2006.01) | |
| *H01L 29/205* | (2006.01) | |
| *H01L 29/40* | (2006.01) | |
| *H01L 29/417* | (2006.01) | |
| *H01L 23/535* | (2006.01) | |
| *H01L 23/522* | (2006.01) | |
| *H01L 23/528* | (2006.01) | |
| *H01L 23/00* | (2006.01) | |
| *H01L 29/20* | (2006.01) | |
| *H01L 29/423* | (2006.01) | |
| *H01L 29/10* | (2006.01) | |

(52) U.S. Cl.
CPC ...... *H01L 23/5226* (2013.01); *H01L 23/5283* (2013.01); *H01L 23/535* (2013.01); *H01L 24/06* (2013.01); *H01L 29/205* (2013.01); *H01L 29/402* (2013.01); *H01L 29/41758* (2013.01); *H01L 29/7786* (2013.01); *H01L 24/48* (2013.01); *H01L 24/49* (2013.01); *H01L 29/1066* (2013.01); *H01L 29/2003* (2013.01); *H01L 29/42376* (2013.01); *H01L 2224/04042* (2013.01); *H01L 2224/05093* (2013.01); *H01L 2224/0603* (2013.01); *H01L 2224/48137* (2013.01); *H01L 2224/48247* (2013.01); *H01L 2224/48257* (2013.01); *H01L 2224/49111* (2013.01); *H01L 2924/00014* (2013.01); *H01L 2924/1033* (2013.01); *H01L 2924/10344* (2013.01); *H01L 2924/13064* (2013.01)

(58) Field of Classification Search
USPC ................................................. 257/194, 316
See application file for complete search history.

(56) References Cited

U.S. PATENT DOCUMENTS

| | | |
|---|---|---|
| 7,928,475 B2 | 4/2011 | Parikh et al. |
| 8,237,196 B2 | 8/2012 | Saito |
| 8,530,978 B1 | 9/2013 | Chu et al. |
| 9,508,843 B2 | 11/2016 | Lin et al. |
| 10,236,236 B2 * | 3/2019 | Lin ..................... H01L 23/485 |
| 2003/0076639 A1 | 4/2003 | Chen |
| 2003/0082860 A1 * | 5/2003 | Yoshida ............... H01L 29/802 438/184 |
| 2005/0189562 A1 | 9/2005 | Kinzer |
| 2007/0108617 A1 * | 5/2007 | Heiling ............... H01L 23/4824 257/758 |
| 2007/0205506 A1 | 9/2007 | Dragon et al. |
| 2008/0272443 A1 | 11/2008 | Hoshi et al. |
| 2008/0303097 A1 | 12/2008 | Alter et al. |
| 2009/0108459 A1 | 4/2009 | Motoyui |
| 2011/0193171 A1 | 8/2011 | Yamagiwa et al. |
| 2011/0248283 A1 | 10/2011 | Cao et al. |
| 2013/0146946 A1 * | 6/2013 | Tsurumi ............ H01L 29/66431 257/192 |
| 2013/0161692 A1 | 6/2013 | Koudymov |
| 2013/0207120 A1 | 8/2013 | Cheah et al. |
| 2013/0221437 A1 | 8/2013 | Illegems |
| 2014/0001515 A1 | 1/2014 | Kudymov et al. |
| 2015/0295573 A1 | 10/2015 | Suzuki et al. |
| 2015/0340344 A1 | 11/2015 | Lin et al. |
| 2016/0329890 A1 | 11/2016 | Ujita et al. |
| 2017/0154839 A1 | 6/2017 | Lin et al. |

FOREIGN PATENT DOCUMENTS

| | | |
|---|---|---|
| CN | 103178106 A | 6/2013 |
| TW | 200633211 | 9/2006 |
| TW | 201036156 A | 10/2010 |
| TW | 201338113 A | 9/2013 |
| TW | 201340316 A | 10/2013 |
| TW | 201511267 A | 3/2015 |
| TW | 201533906 A | 9/2015 |

* cited by examiner

HETEROJUNCTION SEMICONDUCTOR DEVICE FOR REDUCING PARASITIC CAPACITANCE

CROSS-REFERENCE TO RELATED APPLICATIONS

This application is a Divisional Application of the U.S. application Ser. No. 15/429,184, filed Feb. 10, 2017, which is a continuation-in-part application of U.S. application Ser. No. 15/297,123, filed Oct. 18, 2016, now U.S. Pat. No. 10,084,076, issued on Sep. 25, 2018, which is a continuation application of U.S. application Ser. No. 14/496,471, filed Sep. 25, 2014, now U.S. Pat. No. 9,508,843, issued on Nov. 29, 2016, which claims priority to Taiwan Application Serial Number 103106659, filed Feb. 27, 2014 and Taiwan Application Serial Number 103114340, filed Apr. 21, 2014, which are herein incorporated by reference in their entireties. U.S. application Ser. No. 14/496,471 is a continuation-in-part application of U.S. application Ser. No. 14/185,322, filed Feb. 20, 2014, now U.S. Pat. No. 8,957,493, issued on Feb. 17, 2015, which claims priority to Taiwan Application Serial Number 102132512, filed Sep. 10, 2013, which are herein incorporated by reference in their entireties.

BACKGROUND

Field of Disclosure

The present disclosure relates to a semiconductor device.

Description of Related Art

A nitride semiconductor has high electric breakdown field and high electron saturation velocity. Thus, the nitride semiconductor is expected to be a semiconductor material for semiconductor devices having high breakdown voltage and low on-state resistance. Many of the conventional semiconductor devices using the nitride related materials may have heterojunctions. The heterojunction is configured with two types of nitride semiconductors having different bandgap energies from each other and is able to generate a two-dimensional electron gas layer (2DEG layer) near the junction plane. The semiconductor devices having the heterojunction may achieve a low on-state resistance. These types of semiconductor devices are called high electron mobility transistors (HEMT).

SUMMARY

An aspect of the present disclosure provides a semiconductor device including an active layer, at least one source electrode, at least one drain electrode, at least one gate electrode, a first insulating layer, at least one first source pad, and at least one first drain pad. The active layer has an active region. The source electrode and the drain electrode are disposed on the active region of the active layer and arranged along a first direction. The gate electrode is disposed on the active region of the active layer and between the source electrode and the drain electrode. The first insulating layer is disposed on the source electrode, the drain electrode, and the gate electrode. The first source pad is disposed on the first insulating layer and the active region of the active layer. The first source pad includes a first source body and at least one first source branch. The first source body is disposed on the source electrode and the drain electrode and extends along the first direction. The first source branch is electrically connected to the first source body and is disposed on the source electrode. The first drain pad is disposed on the first insulating layer and the active region of the active layer. The first drain pad includes a first drain body and at least one first drain branch. The first drain body is disposed on the source electrode and the drain electrode and extends along the first direction. The first drain branch is electrically connected to the first drain body and is disposed on the drain electrode.

In some embodiments, the semiconductor device further includes a second insulating layer disposed on the first insulating layer. The first source body is disposed on the second insulating layer. The first source branch includes a bottom source branch and a top source branch. The bottom source branch is disposed between the first insulating layer and the second insulating layer. The top source branch is disposed on the bottom source branch and the second insulating layer and protrudes from the first source body.

In some embodiments, a plurality of the bottom source branches are spatially separated from each other.

In some embodiments, a space is formed between the source electrode and the first drain body of the first drain pad, and the first source branch is present outside the space.

In some embodiments, the first drain body is disposed on the second insulating layer. The first drain branch includes a bottom drain branch and a top drain branch. The bottom drain branch is disposed between the first insulating layer and the second insulating layer. The top drain branch is disposed on the bottom drain branch and the second drain insulating layer and protrudes from the first drain body.

In some embodiments, a plurality of the bottom drain branches are spatially separated from each other.

In some embodiments, a total thickness of the first insulating layer and the second insulating layer is greater than 4 μm.

In some embodiments, the semiconductor device further includes a second insulating layer disposed on the first insulating layer. The first source branch is disposed between the first insulating layer and the second insulating layer, and the first source body is disposed on the second insulating layer.

In some embodiments, a plurality of the first source branches are spatially separated from each other.

In some embodiments, the first drain branch is disposed between the first insulating layer and the second insulating layer, and the first drain body is disposed on the second insulating layer.

In some embodiments, a plurality of the first drain branches are spatially separated from each other.

In some embodiments, a space is formed between the source electrode and the first drain body of the first drain pad, and the first source branch is present outside the space.

In some embodiments, a total thickness of the first insulating layer and the second insulating layer is greater than 4 μm.

In some embodiments, a plurality of the first source pads are disposed on the first insulating layer and the active region of the active layer.

In some embodiments, a plurality of the first drain pads are disposed on the first insulating layer and the active region of the active layer. The first drain pads and the first source pads are alternately arranged along a second direction different from the first direction.

In some embodiments, an orthogonal projection of the first source pad on the active layer forms a source pad region, and an orthogonal projection of the drain electrode on the active layer forms a drain region. The source pad region overlaps at least a portion of the drain region, and an area of an overlapping region between the source pad region and the drain region being smaller than or equal to 40% of an area of the drain region.

In some embodiments, the semiconductor device further includes a third insulating layer disposed between the first insulating layer and the active layer. The source electrode includes a bottom source portion and a top source portion. The bottom source portion is disposed between the third insulating layer and the active layer. The top source portion is disposed between the first insulating layer and the third insulating layer. The bottom source portion is electrically connected to the top source portion.

In some embodiments, the drain electrode includes a bottom drain portion and a top drain portion. The bottom drain portion is disposed between the third insulating layer and the active layer. The top drain portion is disposed between the first insulating layer and the third insulating layer. The bottom drain portion is electrically connected to the top drain portion.

In some embodiments, the semiconductor device further includes a fourth insulating layer, a second source pad, and a second drain pad. The fourth insulating layer is disposed on the first source pad and the first drain pad. The second source pad is disposed on the fourth insulating layer and is electrically connected to the first source pad. The second drain pad is disposed on the fourth insulating layer and is electrically connected to the first source pad.

In some embodiments, the second source pad includes a second source body and at least one second source branch. The second source branch protrudes from the second source body and is disposed on the first source body of the first source pad.

In some embodiments, the second source pad further includes a third source branch protruding from the second source branch and is disposed on the first source branch.

In some embodiments, the semiconductor device further includes a via disposed between and electrically connected to the third source branch and the first source branch.

In some embodiments, the semiconductor device further includes a fourth insulating layer, a plurality of second source pads, and a plurality of second drain pads. The fourth insulating layer is disposed on the first source pad and the first drain pad. The second source pads are disposed on the fourth insulating layer and are electrically connected to the first source pad. The second drain pads are disposed on the fourth insulating layer and are electrically connected to the first source pad. The second source pads and the second drain pads are alternately arranged along the first direction.

In some embodiments, the semiconductor device further includes a gate layer disposed between the gate electrode and the active layer.

In some embodiments, the semiconductor device further includes a passivation layer disposed between the first insulating layer and the active layer. At least a portion of the passivation layer is disposed between the gate electrode and the gate layer.

DETAILED DESCRIPTION

Figure 1:
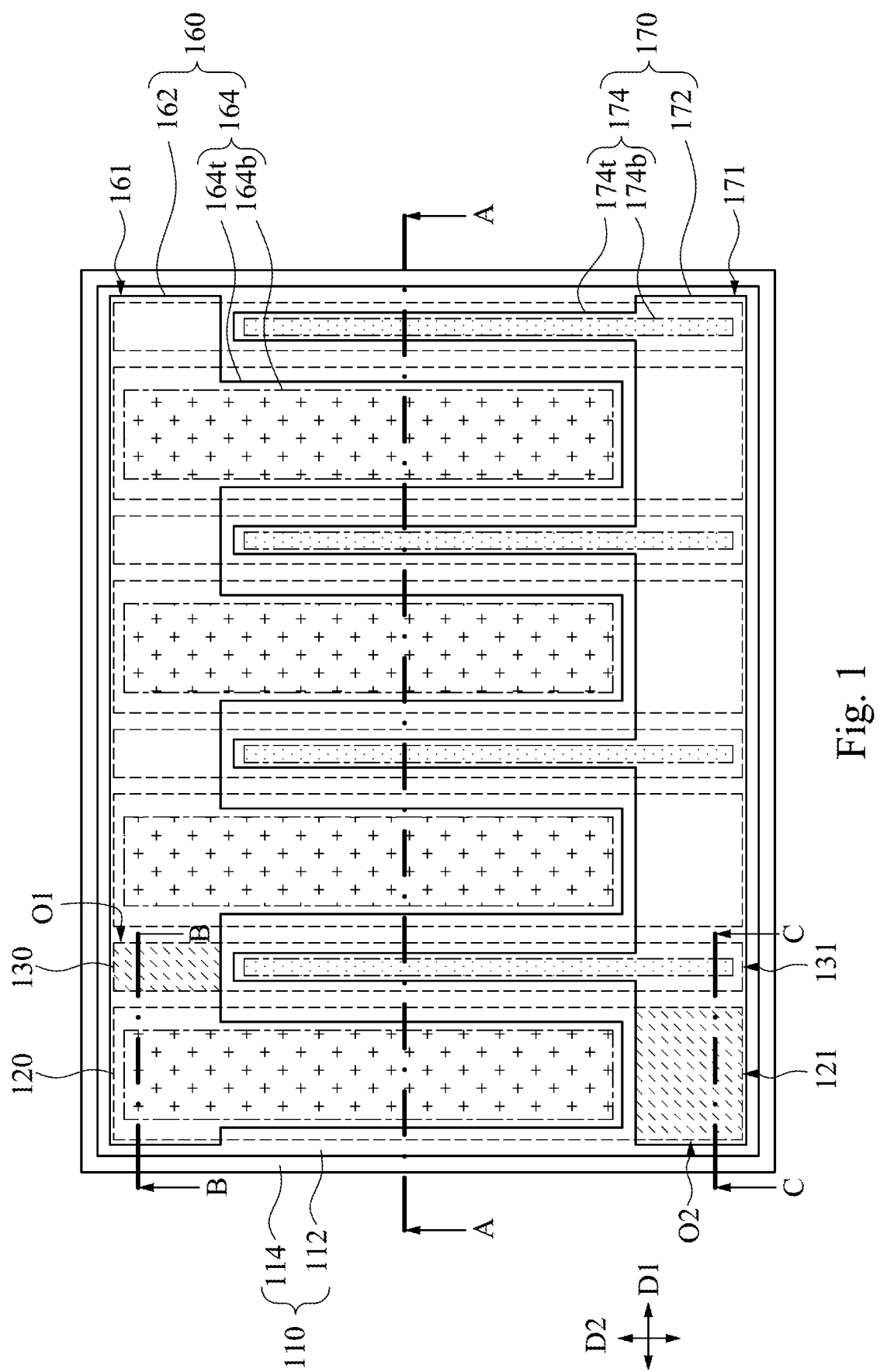
FIG. 1 is a top view of a semiconductor device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2A:
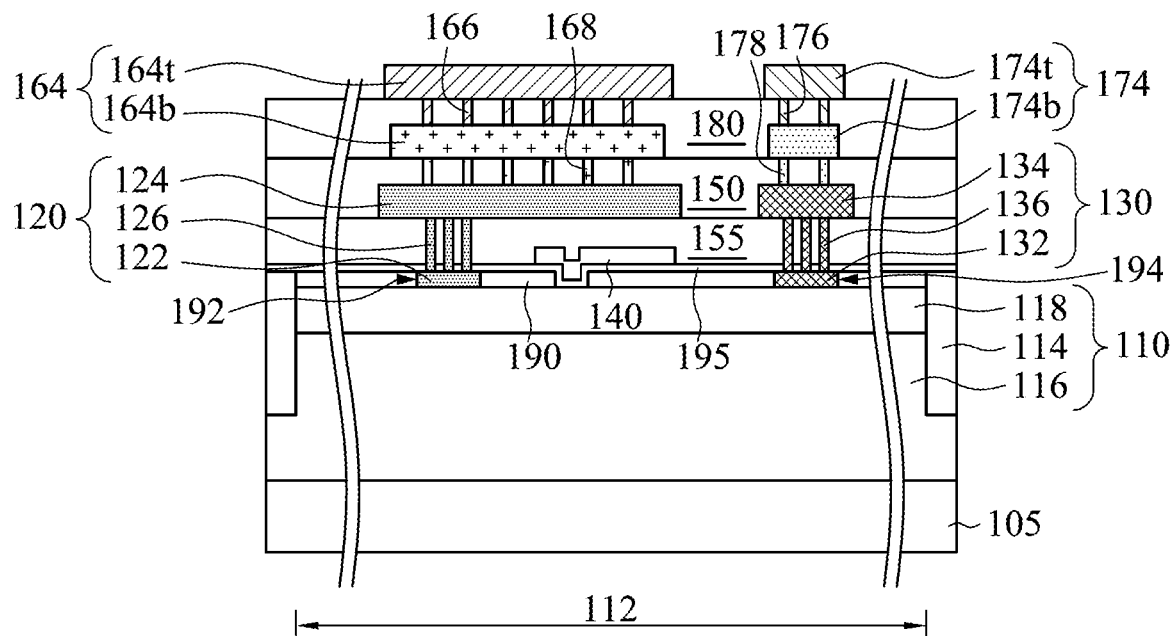
FIG. 2A is a cross-sectional view taking along line A-A of FIG. 1.

FIG. 1 is a top view of a semiconductor device according to one embodiment of the present disclosure, and FIG. 2A is a cross-sectional view taking along line A-A of FIG. 1. The semiconductor device includes an active layer 110, at least one source electrode 120, at least one drain electrode 130, at least one gate electrode 140, a first insulating layer 150, at least one first source pad 160, and at least one first drain pad 170. For clarity, the gate electrode 140 and the first insulating layer 150 are illustrated in FIG. 2A and are omitted in FIG. 1. The active layer 110 has an active region 112. The source electrode 120 and the drain electrode 130 are disposed on the active region 112 of the active layer 110 and arranged along a first direction D1. The gate electrode 140 is disposed on the active region 112 of the active layer 110 and between the source electrode 130 and the drain electrode 140. The semiconductor device in FIG. 1 includes a plurality of the source electrodes 120 and a plurality of drain electrodes 130, and a plurality of gate electrodes 140 are respectively disposed between the source electrodes 120 and the drain electrodes 130. The first insulating layer 150 is disposed on the source electrode 120, the drain electrode 130, and the gate electrode 140. The first source pad 160 is disposed on the first insulating layer 150 and the active region 112 of the active layer 110. The first source pad 160 includes a first source body 162 and at least one first source branch 164. The first source body 162 is disposed on the active region 112, the source electrode 120 and the drain electrode 130 and extends along the first direction D1. The first source branch 164 is electrically connected to the first source body 162 and is disposed on the source electrode 120. The first drain pad 170 is disposed on the first insulating layer 150 and the active region 112 of the active layer 110. The first drain pad 170 includes a first drain body 172 and at least one first drain branch 174. The first drain body 172 is disposed on the active region 112, the source electrode 120 and the drain electrode 130 and extends along the first direction D1. The first drain branch 174 is electrically connected to the first drain body 172 and is disposed on the drain electrode 130. In this embodiment, the first source branch 164 and the first drain branch 174 are disposed between the first source body 162 and the first drain body 172. Further, the semiconductor device may include a gate pad (not shown) connected to the gate electrodes 140.

Figure 2B:
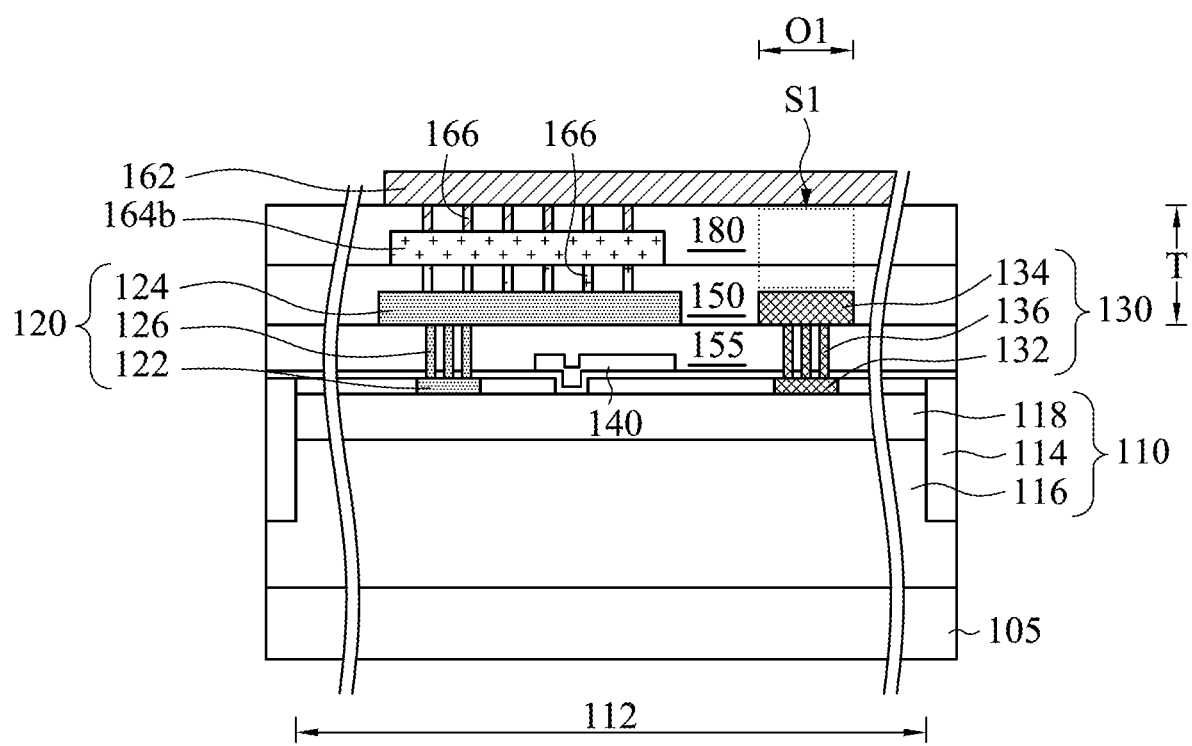
FIG. 2B is a cross-sectional view taking along line B-B of FIG. 1.

FIG. 2B is a cross-sectional view taking along line B-B of FIG. 1. In FIGS. 1, 2A and 2B, the semiconductor device further includes a second insulting layer 180 disposed on the first insulating layer 150. The first source body 162 is disposed on the second insulating layer 180, and the first source branch 164 includes a bottom source branch 164b and a top source branch 164t. The bottom source branch 164b is disposed between the first insulating layer 150 and the second insulating layer 180, and the top source branch 164t is disposed on the bottom source branch 164b and the second insulating layer 180 and protrudes from the first source body 162. In other words, the first source body 162 and a plurality of the top source branches 164t are on the same level. In some embodiments, the first source body 162 and the top source branches 164t are integrally formed. The top source branches 164t extend along a second direction D2 different from the first direction D1. That is, the top source branches 164t and the first source body 162 extend along different directions. Hence, the first source body 162 and the top source branches 164t form a finger shaped structure. In some embodiments, the second direction D2 is substantially perpendicular to the first direction D1, and the present disclosure is not limited in this respect. Further, the top source branches 164t may be strip-shaped, wave-shaped, zigzag-shaped, irregularly shaped, or combinations thereof.

In FIG. 1, a plurality of bottom source branches 164b are spatially separated from each other. That is, the second insulating layer 180 is further disposed among the bottom source branches 164b. The bottom source branches 164b may have the same or similar shape to the top source branches 164t. That is, the bottom source branches 164b may be strip-shaped, wave-shaped, zigzag-shaped, irregularly shaped, or combinations thereof.

In FIG. 2A, the semiconductor device further includes at least one via 166 disposed in the second insulating layer 180 and between the bottom source branches 164b and the top source branches 164t. The via 166 interconnects the bottom source branches 164b and the top source branches 164t. Therefore, the bottom source branches 164b can be electrically connected to the top source branches 164t through the via 166. Moreover, the semiconductor further includes at least one via 168 disposed in the first insulating layer 150 and between the bottom source branches 164b and the source electrode 120. The via 168 interconnects the bottom source branches 164b and the source electrode 120. Therefore, the bottom source branches 164b can be electrically connected to the source electrode 120 through the via 168.

Figure 2C:
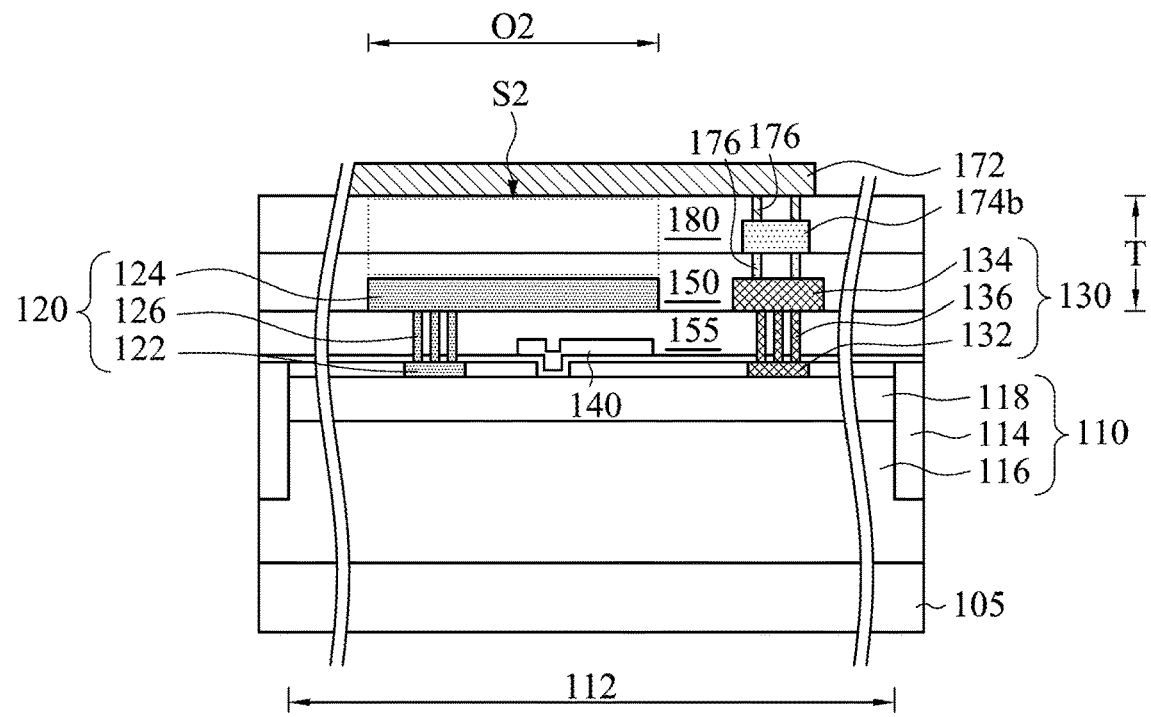
FIG. 2C is a cross-sectional view taking along line C-C of FIG. 1.

FIG. 2C is a cross-sectional view taking along line C-C of FIG. 1. Reference is made to FIGS. 1, 2A and 2C. The first drain body 172 is disposed on the second insulating layer 180, and the first drain branch 174 includes a bottom drain branch 174b and a top drain branch 174t. The bottom drain branch 174b is disposed between the first insulating layer 150 and the second insulating layer 180, and the top drain branch 174t is disposed on the bottom drain branch 174b and the second insulating layer 180 and protrudes from the first drain body 172. In other words, the first drain body 172 and a plurality of the top drain branches 174t are on the same level. In some embodiments, the first drain body 172 and the top drain branches 174t are integrally formed. The top drain branches 174t extend along the second direction D2. That is, the top drain branches 174t and the first drain body 172 extend along different directions. Hence, the first drain body 172 and the top drain branches 174t form a finger shaped structure. Further, the top drain branches 174t may be strip-shaped, wave-shaped, zigzag-shaped, irregularly shaped, or combinations thereof. Moreover, the top drain branches 174t and the top source branches 164t are alternately arranged along the first direction D1.

In FIG. 1, a plurality of bottom drain branches 174b are spatially separated from each other. That is, the second insulating layer 180 is further disposed among the bottom drain branches 164b. The bottom drain branches 164b may have the same or similar shape to the top drain branches 164t. That is, the bottom drain branches 164b may be strip-shaped, wave-shaped, zigzag-shaped, irregularly shaped, or combinations thereof. Moreover, the bottom drain branches 174b and the bottom source branches 164b are alternately arranged along the first direction D1.

In FIG. 2A, the semiconductor device further includes at least one via 176 disposed in the second insulating layer 180 and between the bottom drain branches 174b and the top drain branches 174t. The via 176 interconnects the bottom drain branches 174b and the top drain branches 174t. Therefore, the bottom drain branches 174b can be electrically connected to the top drain branches 174t through the via 176. Moreover, the semiconductor device further includes at least one via 178 disposed in the first insulating layer 150 and between the bottom drain branches 174b and the drain electrode 130. The via 178 interconnects the bottom drain branches 174b and the drain electrode 130. Therefore, the bottom drain branches 174b can be electrically connected to the drain electrode 130 through the via 178.

In FIG. 2A, the semiconductor device further includes a third insulating layer 155 disposed between the first insulating layer 150 and the active layer 110. The source electrode 120 includes a bottom source portion 122, a top source portion 124, and at least one via 126. The bottom source portion 122 is disposed between the third insulating layer 155 and the active layer 110. The top source portion 124 is disposed between the first insulating layer 150 and the third insulating layer 155. The via 126 is disposed between the bottom source portion 122 and the top source portion 124. The via 126 interconnects the bottom source portion 122 and the top source portion 124. Therefore, the bottom source portion 122 can be electrically connected to the top source portion 124 through the via 126. In some embodiments, the top source portion 124 is further disposed on the gate electrode 140. The bottom source portion 122 of the source electrode 120 directly electrodes the active layer 110 and may be an ohmic electrode having a large resistance value per unit length. Hence, the top source portion 124 that has a resistance value per unit length smaller than the resistance value of the bottom source portion 122 per unit length is added over the bottom source portion 122. As a result, the overall resistance value of the source electrode 120 is reduced by electrically connecting the top source portion 124 to the bottom source portion 122.

Moreover, the drain electrode 130 includes a bottom drain portion 132, a top drain portion 134, and at least one via 136. The bottom drain portion 132 is disposed between the third insulating layer 155 and the active layer 110. The top drain portion 134 is disposed between the first insulating layer 150 and the third insulating layer 155. The via 136 is disposed between the bottom drain portion 132 and the top drain portion 134. The via 136 interconnects the bottom drain portion 132 and the top drain portion 134. Therefore, the bottom drain portion 132 can be electrically connected to the top drain portion 134 through the via 136. The bottom drain portion 132 of the drain electrode 130 directly electrodes the active layer 110 and may be an ohmic electrode having a large resistance value per unit length. Hence, the top drain portion 134 that has a resistance value per unit length smaller than the resistance value of the bottom drain portion 132 per unit length is added over the bottom drain portion 132. As a result, the overall resistance value of the drain electrode 130 is reduced by electrically connecting the top drain portion 134 to the bottom drain portion 132.

Reference is made to FIGS. 2A and 2B. A space S1 is formed between the drain electrode 130 and the first source body 162 of the first source pad 160. The first drain branch 174 is present outside the space S1. That is, the first drain branch 174 is not disposed between the drain electrode 130 and the first source body 162. As such, a distance between the first source body 162 and the drain electrode 130 (see FIG. 2B) is greater than a distance between the bottom drain branch 174b and the drain electrode 130 (see FIG. 2A). In some embodiments, a total thickness T of the first insulating layer 150 and the second insulating layer 180 is greater than 4 μm. With such configuration, a capacitance between the first source body 162 and the drain electrode 130 is reduced, and the semiconductor device in this embodiment can increase the breakdown voltage thereof. Further, since the first drain branch 174 includes the top drain branch 174t and the bottom drain branch 174b, the resistance of drain can be reduced.

Reference is made to FIGS. 2A and 2C. A space S2 is formed between the source electrode 120 and the first drain body 172 of the first drain pad 170. The first source branch 164 is present outside the space S2. That is, the first source branch 164 is not disposed between the source electrode 120 and the first drain body 172. As such, a distance between the first drain body 172 and the source electrode 120 (see FIG. 2C) is greater than a distance between the bottom source branch 164b and the source electrode 120 (see FIG. 2A). In some embodiments, a total thickness T of the first insulating layer 150 and the second insulating layer 180 is greater than 4 μm. With such configuration, a capacitance between the first drain body 172 and the source electrode 120 is reduced, and the semiconductor device in this embodiment can increase the breakdown voltage thereof. Further, since the first source branch 164 includes the top source branch 164t and the bottom source branch 164b, the resistance of source can be reduced.

Reference is made to FIGS. 1 and 2B. An orthogonal projection of the first source pad 160 on the active layer 110 forms a source pad region 161, and an orthogonal projection of the drain electrode 130 on the active layer 110 forms a drain region 131. The source pad region 161 overlaps at least a portion of the drain region 131, and an area of an overlapping region O1 between the source pad region 161 and the drain region 131 being smaller than or equal to 40% of an area of the drain region 131.

Reference is made to FIGS. 1 and 2C. Similarly, an orthogonal projection of the first drain pad 170 on the active layer 110 forms a drain pad region 171, and an orthogonal projection of the source electrode 120 on the active layer 110 forms a source region 121. The drain pad region 171 overlaps at least a portion of the source region 121, and an area of an overlapping region O2 between the drain pad region 171 and the source region 121 being smaller than or equal to 40% of an area of the source region 121.

Reference is made to FIGS. 1 and 2A. The active layer 110 further includes an insulation area 114 surrounding the active region 112 to prevent leakage currents from being generated, and thus to increase the breakdown voltage. In FIG. 1, the first source pad 160 and the first drain pad 170 are completely within the active region 112. In other words, the semiconductor device can be cut along the insulation area 114 according to the present embodiment. Hence, the vast majority of the active area 112 is put to good use and it is not necessary to add extra regions to the non-active area for accommodating source pads and drain pads. As a result, the size of the semiconductor device is effectively reduced, or a semiconductor device is fabricated that is able to sustain a higher breakdown voltage or a larger on current with the same device size.

Reference is made to FIG. 2A. In one or more embodiments, the active layer 110 includes a plurality of different nitride-based semiconductor layers to allow two-dimensional electron gas (2DEG) to be generated at the heterojunction so as to create a conducting path. For example, a stack structure made up of a channel layer 116 and a barrier layer 118 may be utilized, and the barrier layer 118 is disposed on the channel layer 116. In some embodiments, the channel layer 116 may be made of gallium nitride (GaN), and the barrier layer 118 may be made of aluminum gallium nitride (AlGaN), and the disclosure is not limited in this respect. With this structure, two-dimensional electron gas can exist at the interface of the channel layer 116 and the barrier layer 118. Thus, when the semiconductor device is in the on state, the on current between the source electrode 120 and the drain electrode 130 is able to flow along the interface of the channel layer 116 and the barrier layer 118. The active layer 110 may be selectively disposed on a substrate 105. The substrate 105 may be a silicon substrate or a sapphire substrate, but the disclosure is not limited in this respect. In one embodiment, the semiconductor device may further include a buffer layer disposed between the active layer 110 and the substrate 105.

In this embodiment, the semiconductor device may further include a passivation layer 190 disposed on the active layer 110. The passivation layer 190 has at least one source opening 192 and at least one drain opening 194 within it. At least a portion of the source electrode 120 and at least a portion of the drain electrode 130 are respectively disposed in the source opening 192 and the drain opening 194. For example in FIG. 2A, the source electrode 120 and the drain electrode 130 are respectively disposed in the source opening 192 and the drain opening 194 to electrically electrode the active layer 110. In some embodiments, the semiconductor device further includes a gate dielectric layer 195 at least disposed between the gate electrode 140 and the passivation layer 190.

Figure 2D:
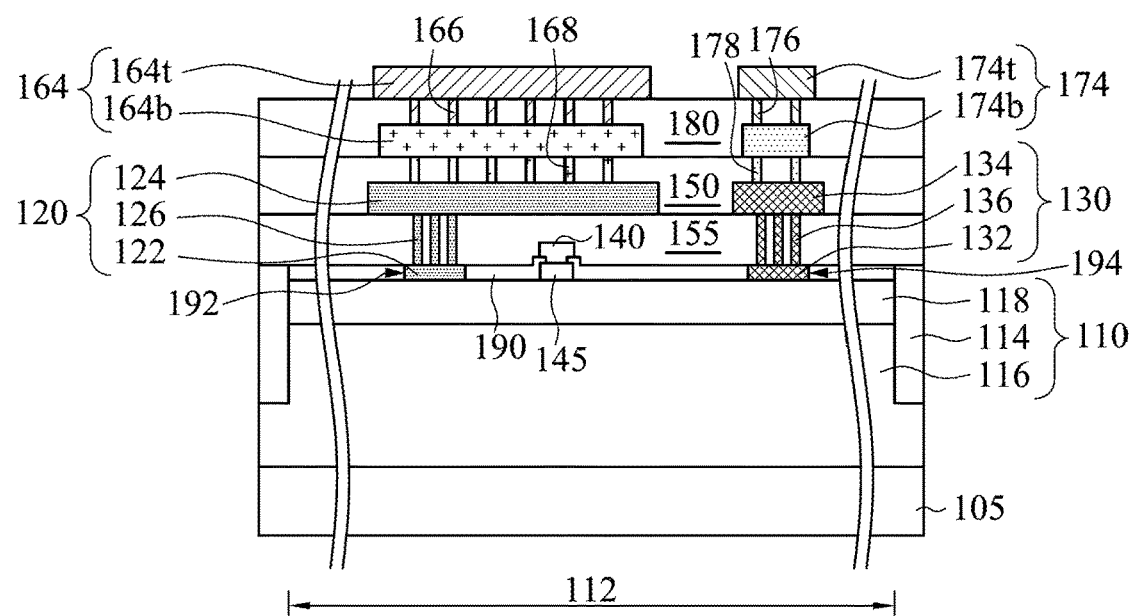
FIG. 2D is a cross-sectional view of a semiconductor device according to another embodiment of the present disclosure.

FIG. 2D is a cross-sectional view of a semiconductor device according to another embodiment of the present disclosure. The cross-sectional view of FIG. 2D is the same as that of FIG. 2A. The difference between the semiconductor devices of FIGS. 2D and 2A is the configuration of the gate electrode. In FIG. 2D, the semiconductor device includes a gate layer 145 disposed between the gate electrode 140 and the active layer 110. At least a portion of the passivation layer 190 is disposed between the gate electrode 140 and the gate layer 145. The gate layer 145 may include p-type doped materials. As such, the semiconductor device of FIG. 2D is an enhancement type transistor while the semiconductor device of FIG. 2A is an depletion type transistor. Other relevant structural details of the semiconductor device in FIG. 2D are similar to the semiconductor device in FIG. 2A, and, therefore, a description in this regard will not be repeated hereinafter.

Figure 3A:
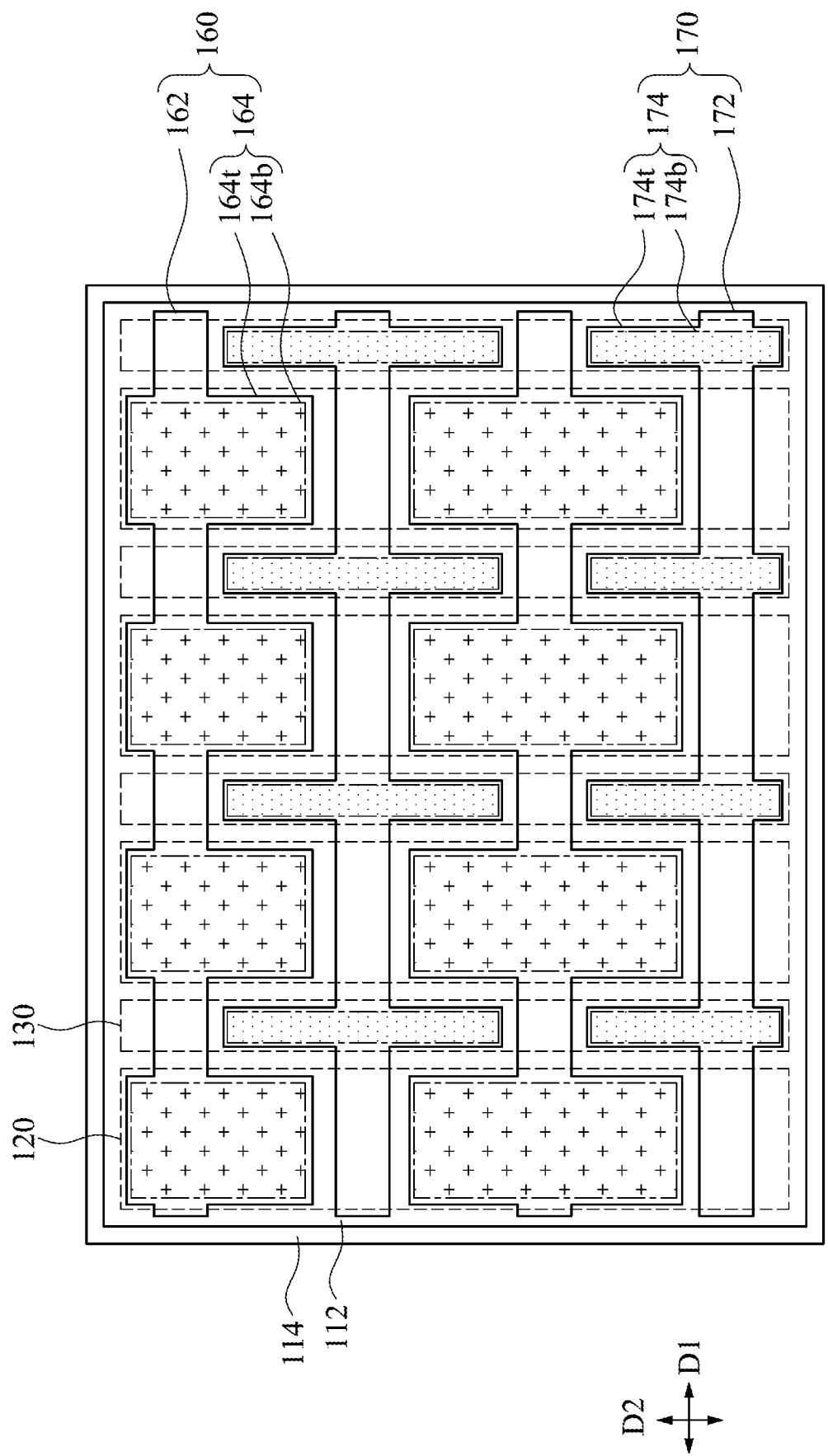
FIG. 3A is a top view of a semiconductor device according to another embodiment of the present disclosure.

FIG. 3A is a top view of a semiconductor device according to another embodiment of the present disclosure. The difference between the semiconductor devices in FIGS. 3A and 1 pertains to the configurations of the first source pad 160 and the first drain pad 170. In FIG. 3A, the semiconductor device includes a plurality of the first source pads 160 and a plurality of the first drain pads 170 disposed on the active region 112 of the active layer 110. The first source pad 160 and the first drain pad 170 are alternately arranged along the second direction D2. Further, the top source branch 164t and the first source body 162 form a cross shaped configuration, and the top drain branch 174t and the first drain body 172 form a cross shaped configuration. Other relevant structural details of the semiconductor device in FIG. 3A are similar to the semiconductor device in FIG. 1, and, therefore, a description in this regard will not be repeated hereinafter.

Figure 3B:
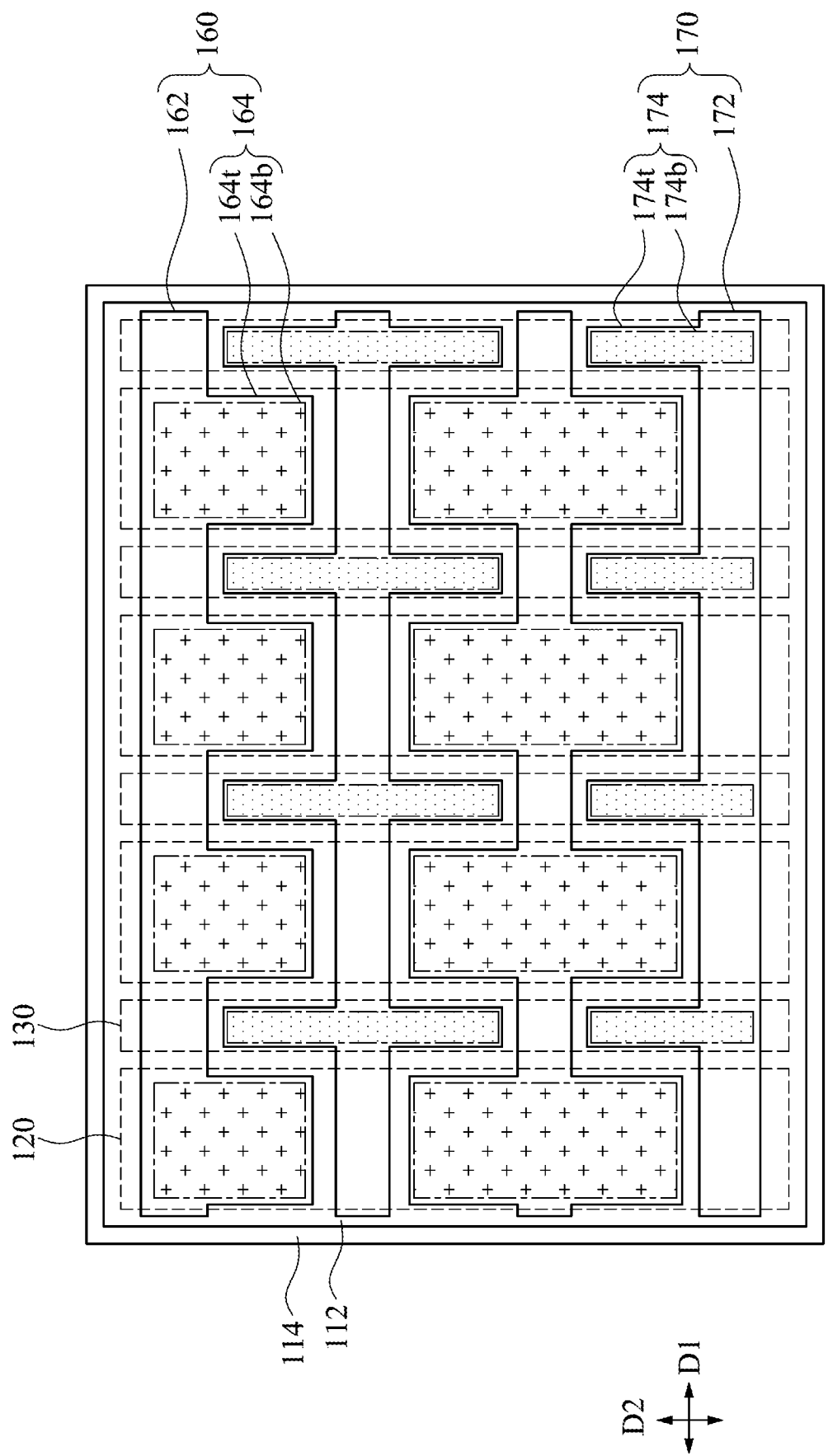
FIG. 3B is a top view of a semiconductor device according to another embodiment of the present disclosure.

FIG. 3B is a top view of a semiconductor device according to another embodiment of the present disclosure. The difference between the semiconductor devices in FIGS. 3B and 3A pertains to the configurations of the first source pad 160 and the first drain pad 170. In FIG. 3B, the top source branch 164t and the first source body 162 of one of the first source pads 160 form a finger shaped configuration, and the top source branch 164t and the first source body 162 of another one of the first source pads 160 form a cross shaped configuration. Similarly, the top drain branch 174t and the first drain body 172 of one of the first drain pads 170 form a finger shaped configuration, and the top drain branch 174t and the first drain body 172 of another one of the first drain pads 170 form a cross shaped configuration. In FIGS. 3A and 3B, the top source branch 164t (the top drain branch 174t) and the bottom source branch 164b (the bottom drain branch 174b) have substantially the same shape, and the top source branch 164t (the top drain branch 174t) covers the whole bottom source branch 164b (the whole bottom drain branch 174b). In some other embodiments, however, the top source branch 164t (the top drain branch 174t) and the bottom source branch 164b (the bottom drain branch 174b) have different shapes. For example, the bottom source branch 164b (the bottom drain branch 174b) extends past a side of the top source branch 164t (the top drain branch 174t), i.e., the top source branch 164t (the top drain branch 174t) covers a portion of the bottom source branch 164b (the bottom drain branch 174b). Other relevant structural details of the semiconductor device in FIG. 3B are similar to the semiconductor device in FIG. 3A, and, therefore, a description in this regard will not be repeated hereinafter.

Figure 4:
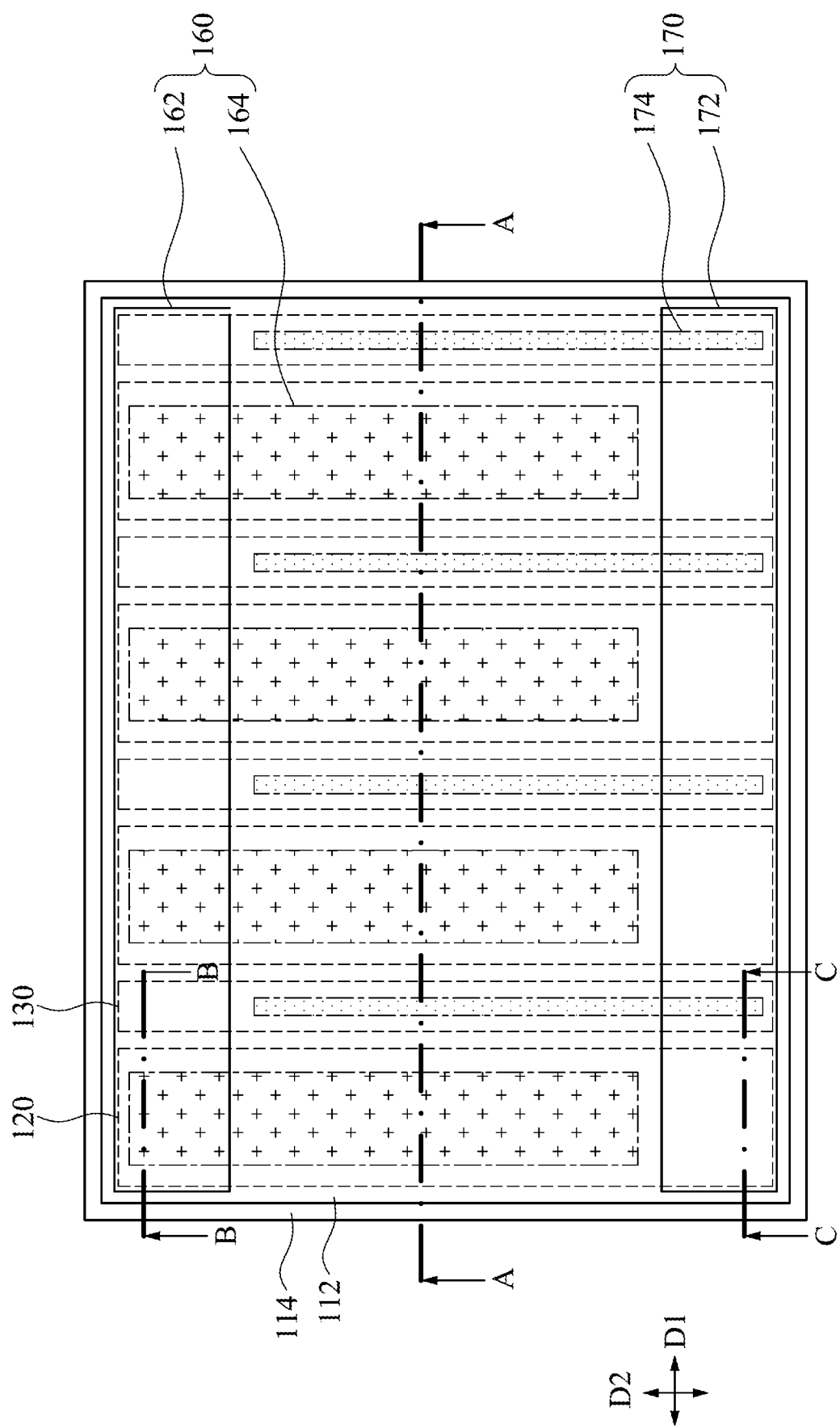
FIG. 4 is a top view of a semiconductor device according to another embodiment of the present disclosure.
Figure 5A:
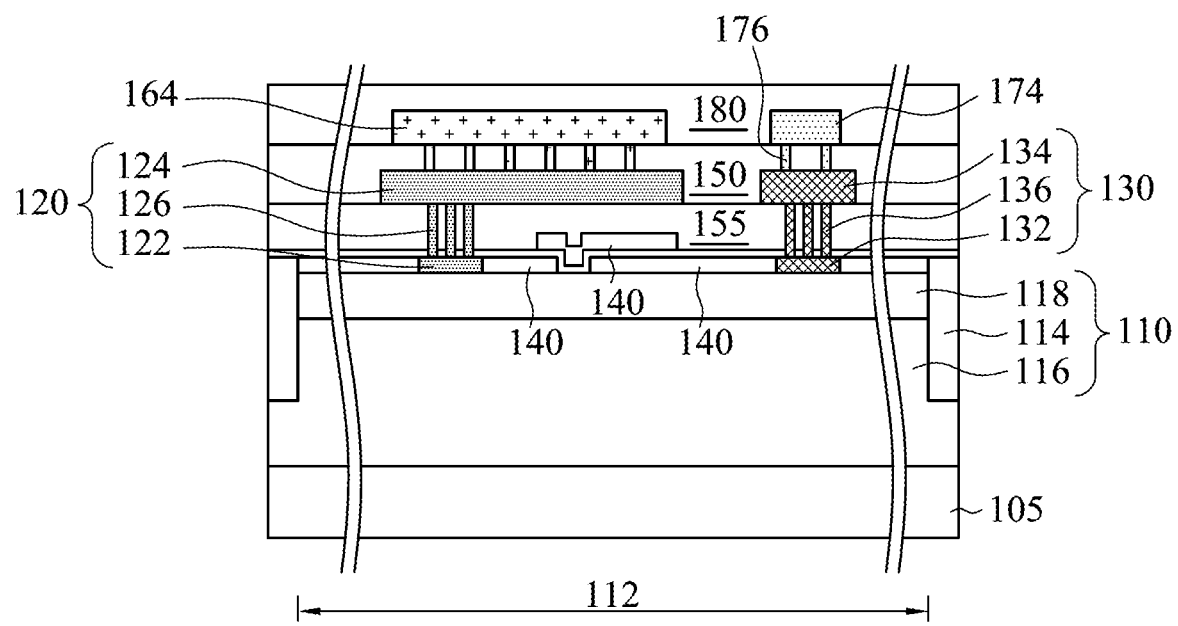
FIG. 5A is a cross-sectional view taking along line A-A of FIG. 4.
Figure 5B:
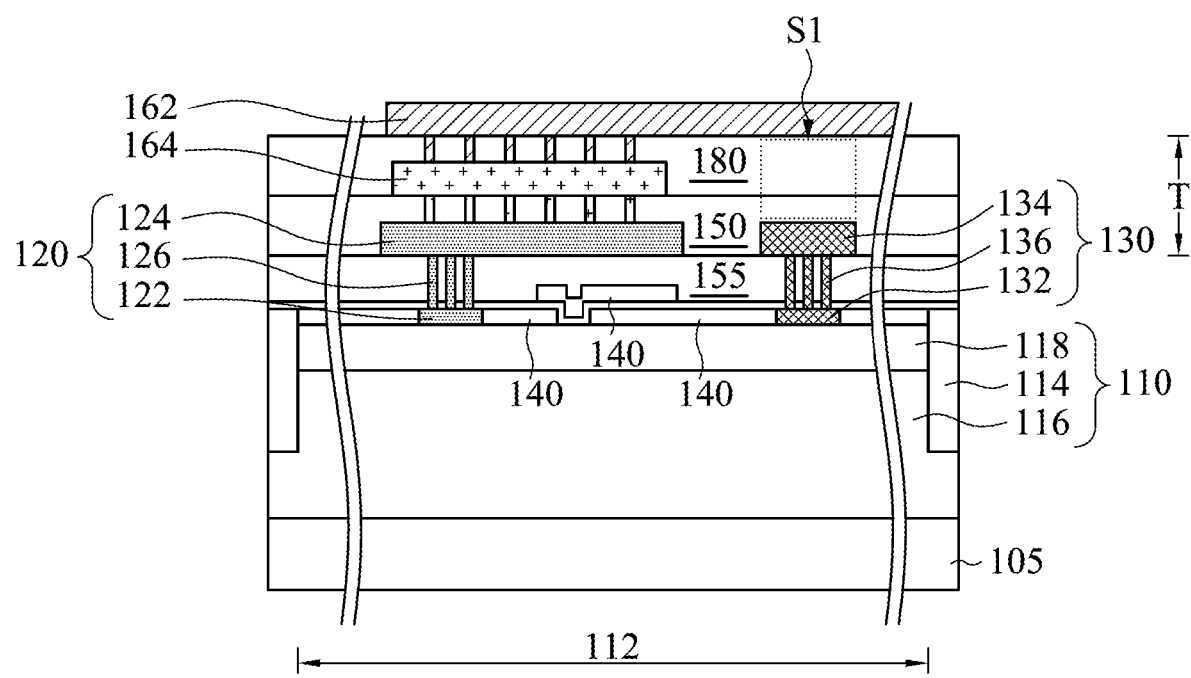
FIG. 5B is a cross-sectional view taking along line B-B of FIG. 4.
Figure 5C:
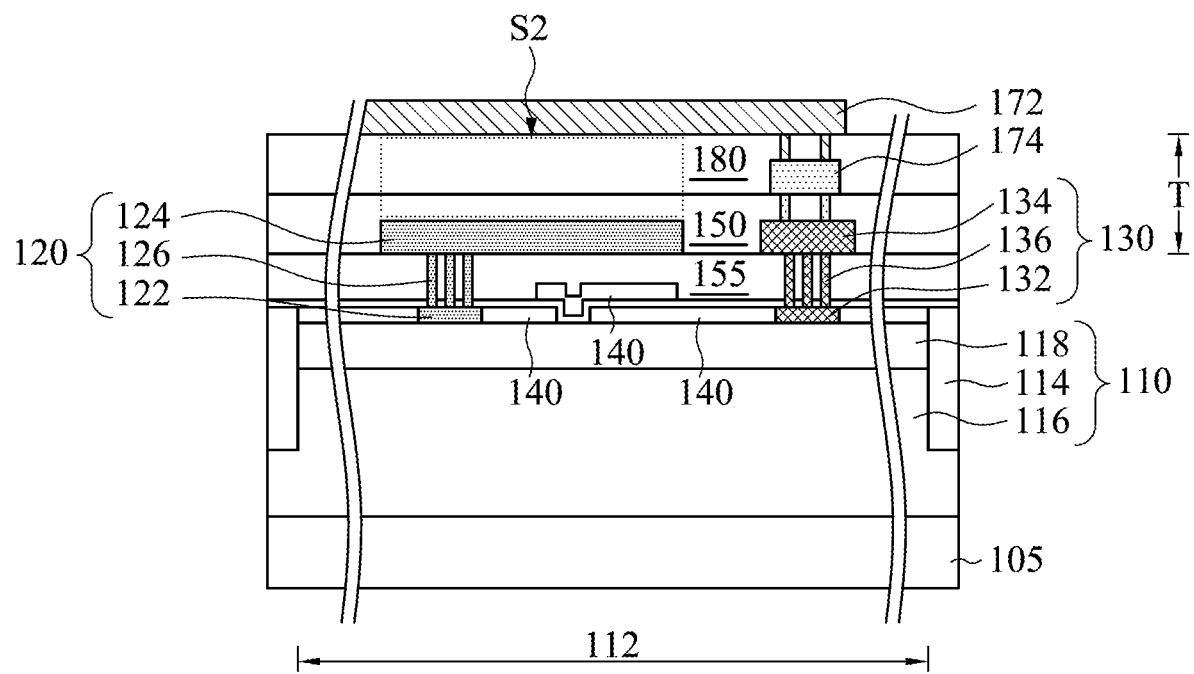
FIG. 5C is a cross-sectional view taking along line C-C of FIG. 4.

FIG. 4 is a top view of a semiconductor device according to another embodiment of the present disclosure, FIG. 5A is a cross-sectional view taking along line A-A of FIG. 4, FIG. 5B is a cross-sectional view taking along line B-B of FIG. 4, and FIG. 5C is a cross-sectional view taking along line C-C of FIG. 4. The difference between the semiconductor devices in FIGS. 4 and 1 pertains to the configurations of the first source pad 160 and the first drain pad 170. In FIG. 5A, the first source branches 164 and the first drain branches 174 are disposed between the first insulating layer 150 and the second insulating layer 180; in FIG. 5B, the first source body 162 is disposed on the second insulating layer 180; in FIG. 5C, the first drain body 172 is disposed on the second insulating layer 180. In FIG. 4, he first source branches 164 are spatially separated from each other, and the first drain branches 174 are spatially separated from each other. The first source branches 164 and the first drain branches 174 are alternately arranged along the first direction D1.

Reference is made to FIGS. 5A and 5B. A space S1 is formed between the drain electrode 130 and the first source body 162 of the first source pad 160. The first drain branch 174 is present outside the space S1. That is, the first drain branch 174 is not disposed between the drain electrode 130 and the first source body 162. As such, a distance between the first source body 162 and the drain electrode 130 (see FIG. 5B) is greater than a distance between the first drain branch 174 and the drain electrode 130 (see FIG. 5A). In some embodiments, the total thickness T of the first insulating layer 150 and the second insulating layer 180 is greater than 4 µm. With such configuration, a capacitance between the first source body 162 and the drain electrode 130 is reduced, and the semiconductor device in this embodiment can increase the breakdown voltage thereof.

Reference is made to FIGS. 5A and 5C. A space S2 is formed between the source electrode 120 and the first drain body 172 of the first drain pad 170. The first source branch 164 is present outside the space S2. That is, the first source branch 164 is not disposed between the source electrode 120 and the first drain body 172. As such, a distance between the first drain body 172 and the source electrode 120 (see FIG. 5C) is greater than a distance between the bottom source branch 164b and the source electrode 120 (see FIG. 5A). In some embodiments, a total thickness T of the first insulating layer 150 and the second insulating layer 180 is greater than 4 µm. With such configuration, a capacitance between the first drain body 172 and the source electrode 120 is reduced, and the semiconductor device in this embodiment can increase the breakdown voltage thereof. Other relevant structural details of the semiconductor device in FIGS. 4-5C are similar to the semiconductor device in FIGS. 1-2C, and, therefore, a description in this regard will not be repeated hereinafter.

Figure 6:
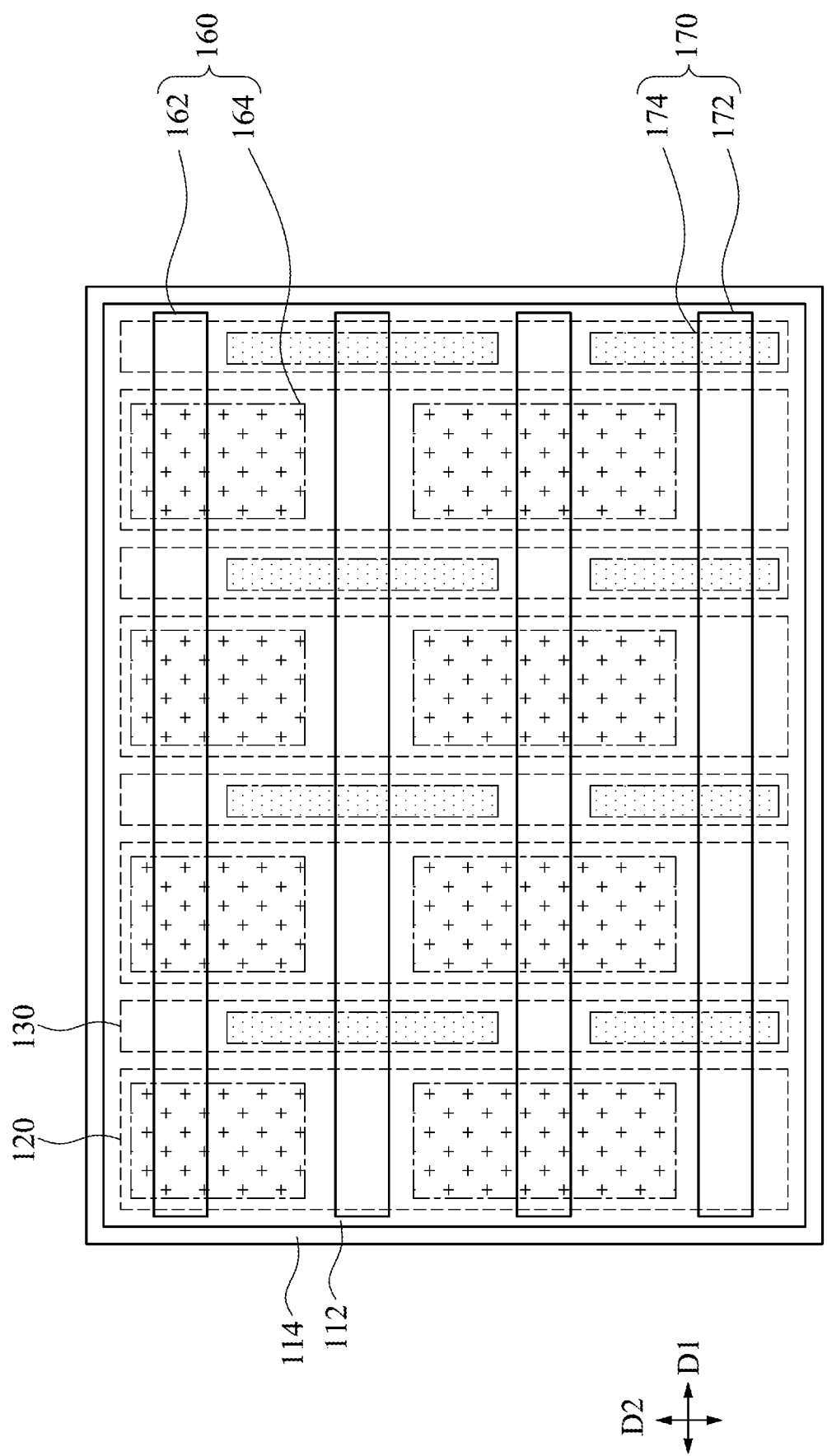
FIG. 6 is a top view of a semiconductor device according to another embodiment of the present disclosure.

FIG. 6 is a top view of a semiconductor device according to another embodiment of the present disclosure. The difference between the semiconductor devices in FIGS. 6 and 4 pertains to the configurations of the first source pad 160 and the first drain pad 170. In FIG. 6, the semiconductor device includes a plurality of the first source pad 160 and a plurality of the first drain pad 170. The first source pad 160 and the first drain pad 170 are alternately arranged along the second direction D2. Further, the first source branch 164 and the first source body 162 form a cross or finger shaped configuration, and the first drain branch 174 and the first drain body 172 form a cross or finger shaped configuration. Other relevant structural details of the semiconductor device in FIG. 6 are similar to the semiconductor device in FIG. 4, and, therefore, a description in this regard will not be repeated hereinafter.

Figure 7:
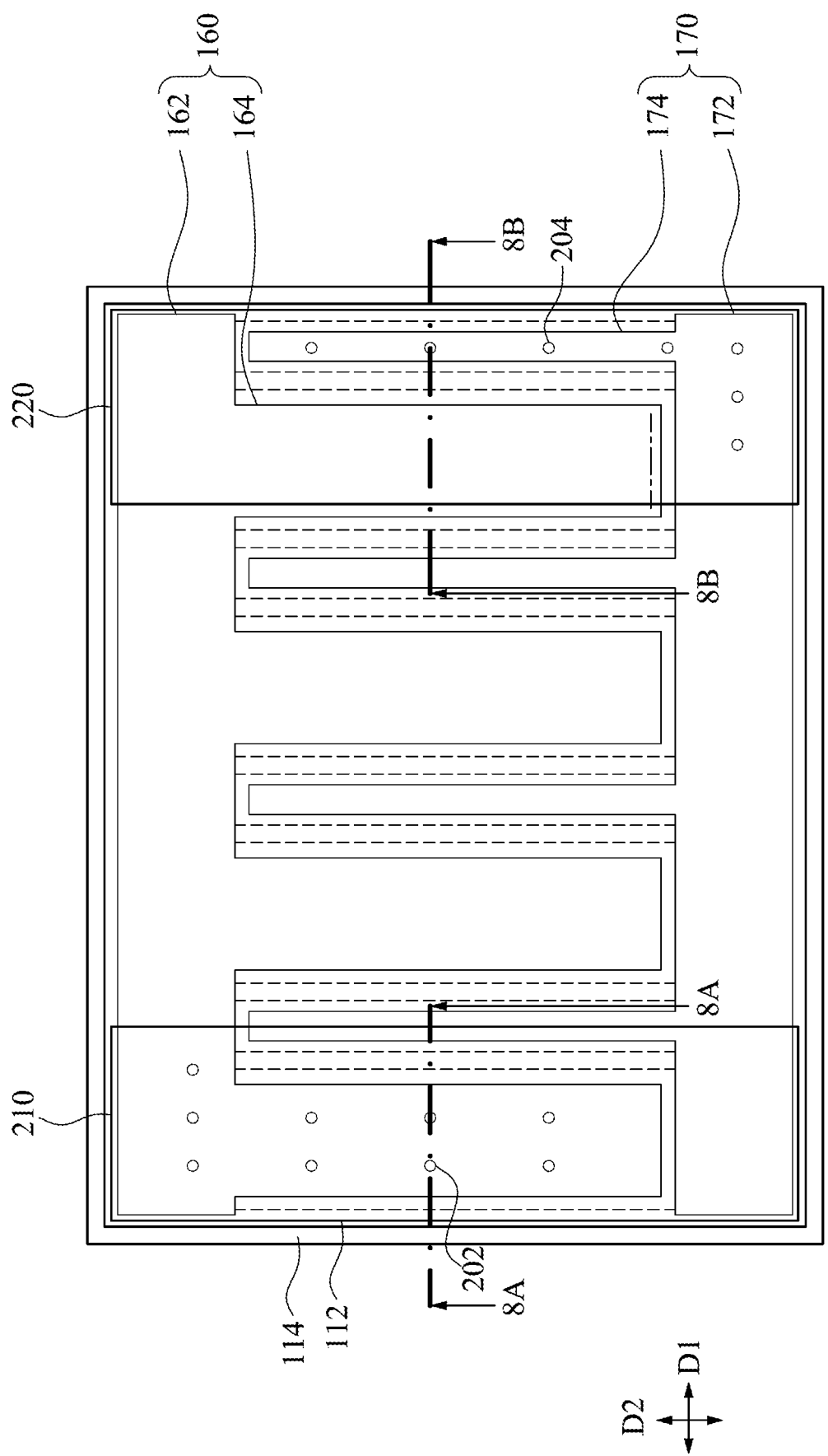
FIG. 7 is a top view of a semiconductor device according to another embodiment of the present disclosure.
Figure 8A:
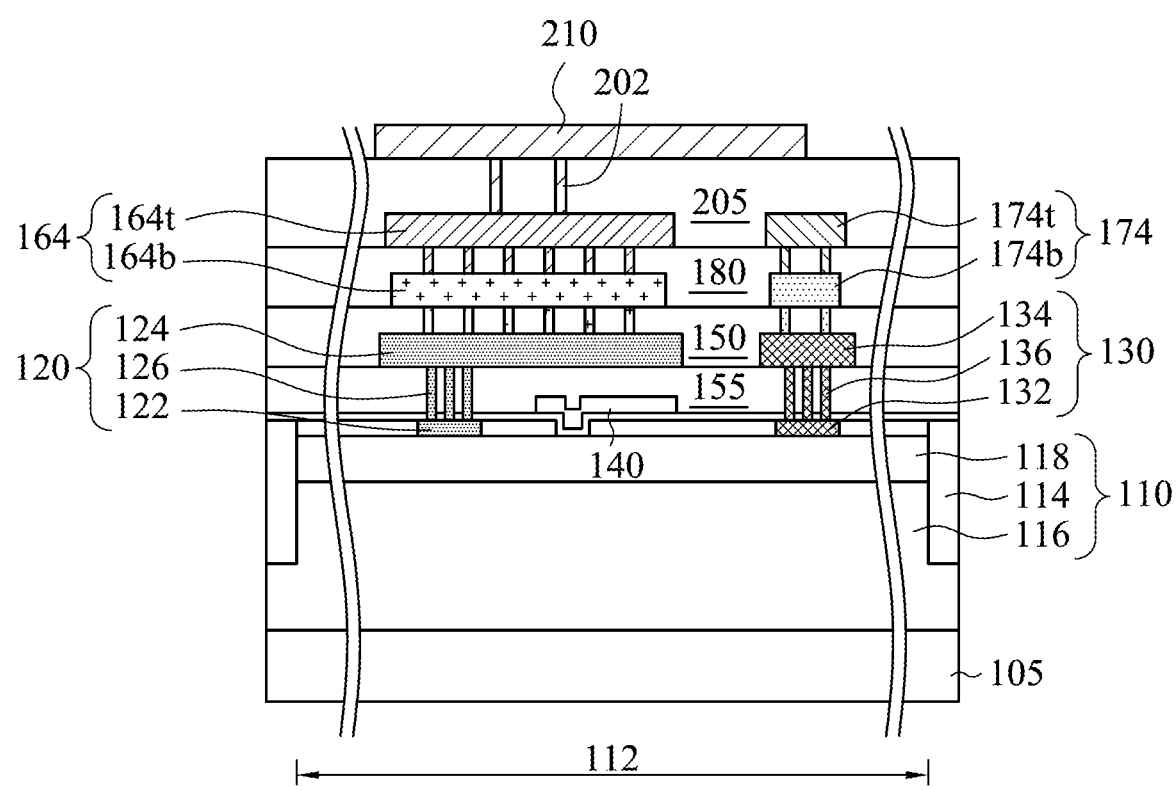
FIG. 8A is a cross-sectional view taking along line 8A-8A of FIG. 7.
Figure 8B:
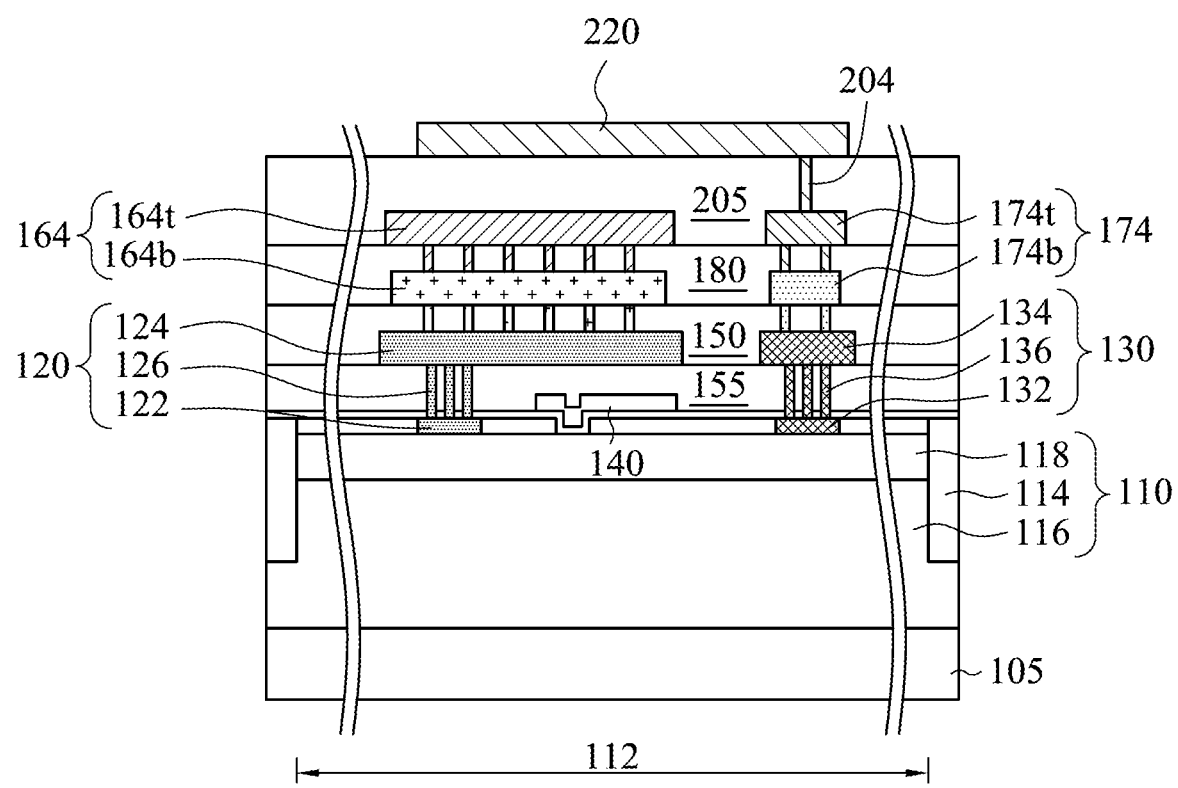
FIG. 8B is a cross-sectional view taking along line 8B-8B of FIG. 7.

FIG. 7 is a top view of a semiconductor device according to another embodiment of the present disclosure, FIG. 8A is a cross-sectional view taking along line 8A-8A of FIG. 7, and FIG. 8B is a cross-sectional view taking along line 8B-8B of FIG. 7. The difference between the semiconductor devices in FIGS. 7-8B and 1-2C pertains to the configuration of the second source pad 210 and the second drain pad 220. In FIGS. 7 to 8B, the semiconductor device further includes a fourth insulating layer 205, a second source pad 210, and a second drain pad 220. The fourth insulating layer 205 is disposed on the first source pad 160 and the first drain pad 170. The second source pad 210 is disposed on the fourth insulating layer 205 and electrically connected to the first source pad 160. For example, the semiconductor device further includes at least one via 202 disposed in the fourth insulating layer 205 and between the first source pad 160 and the second source pad 210. The via 202 interconnects the first source pad 160 and the second source pad 210. Therefore, the second source pad 210 can be electrically connected to the first source pad 160 through the via 202. Further, the second drain pad 220 is disposed on the fourth insulating layer 205 and electrically connected to the first drain pad 170. For example, the semiconductor device further includes at least one via 204 disposed in the fourth insulating layer 205 and between the first drain pad 170 and the second drain pad 220. The via 204 interconnects the first drain pad 170 and the second drain pad 220. Therefore, the second drain pad 220 can be electrically connected to the first drain pad 170 through the via 204. Other relevant structural details of the semiconductor device in FIGS. 7-8B are similar to the semiconductor device in FIGS. 1-2C, and, therefore, a description in this regard will not be repeated hereinafter. It is noted that even though the semiconductor device of FIG. 1 is used as an example in FIG. 7, the second source pad 210 and the second drain pad 220 of FIG. 7 can be applied to any of the semiconductor devices mentioned above (such as the semiconductor devices of FIGS. 3, 4, and 6) according to actual requirements.

Figure 9:
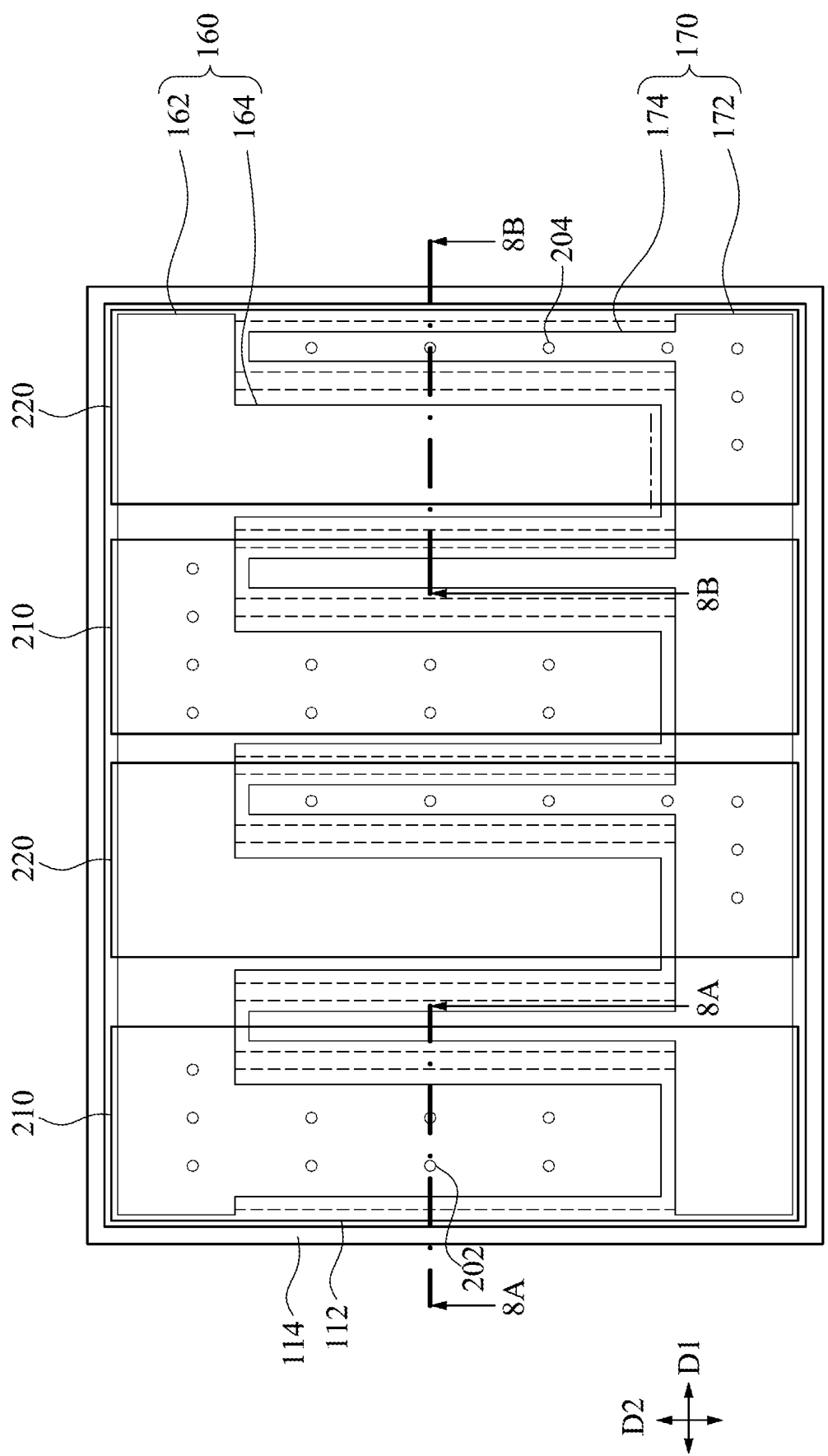
FIG. 9 is a top view of a semiconductor device according to another embodiment of the present disclosure.

FIG. 9 is a top view of a semiconductor device according to another embodiment of the present disclosure. The difference between the semiconductor devices in FIGS. 9 and 7-8B pertains to the number of the second source pad 210 and the second drain pad 220. In FIG. 9, the semiconductor device includes a plurality of second source pads 210 and a plurality of second drain pads 220. The second source pads 210 and the second drain pads 220 are alternately arranged along the first direction D1. Other relevant structural details of the semiconductor device in FIG. 9 are similar to the semiconductor device in FIGS. 7-8B, and, therefore, a description in this regard will not be repeated hereinafter.

Figure 10:
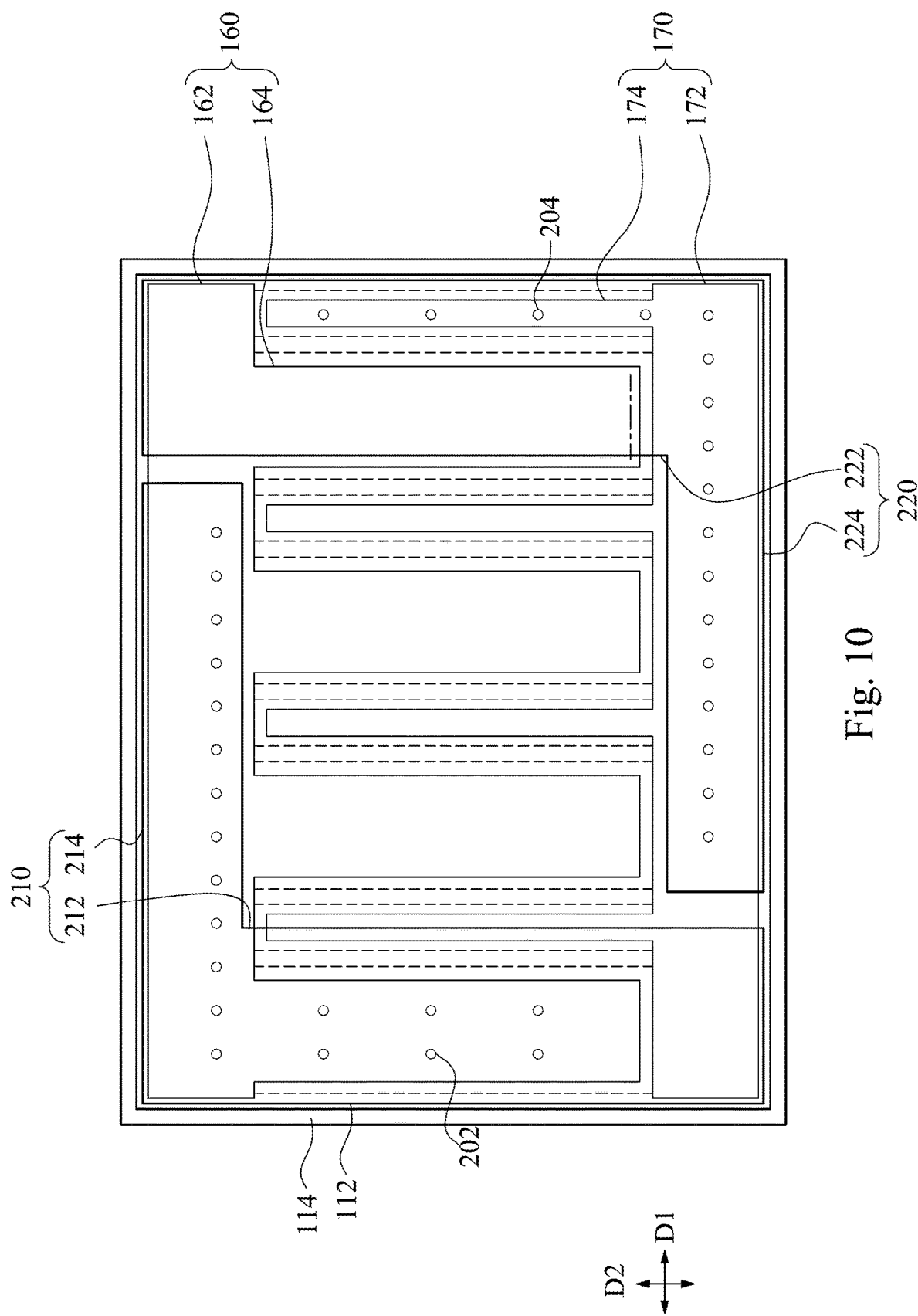
FIG. 10 is a top view of a semiconductor device according to another embodiment of the present disclosure.

FIG. 10 is a top view of a semiconductor device according to another embodiment of the present disclosure. The difference between the semiconductor devices in FIGS. 10 and 7-8B pertains to the configuration of the second source pad 210 and the second drain pad 220. In FIG. 10, the second source pad 210 includes a second source body 212 and at least one second source branch 214. The second source branch 214 protrudes from the second source body 212 and is disposed on the first source body 162 of the first source pad 160. The second source body 212 extends along the second direction D2, and the second source branch 214 extends along the first direction D1.

In some embodiments, some of the vias 202 are disposed between the second source body 212 and the first source pad 160, and other vias 202 are disposed between the second source branch 214 and the first source body 162 of the first source pad 160. Therefore, the resistance of source can be further reduced.

The second drain pad 220 includes a second drain body 222 and at least one second drain branch 224. The second drain branch 224 protrudes from the second drain body 222 and is disposed on the first drain body 172 of the first drain pad 170. The second drain body 222 extends along the second direction D2, and the second drain branch 224 extends along the first direction D1.

In some embodiments, some of the vias 204 are disposed between the second drain body 222 and the first drain pad 170, and other vias 204 are disposed between the second drain branch 224 and the first drain body 172 of the first drain pad 170. Therefore, the resistance of drain can be further reduced. Other relevant structural details of the semiconductor device in FIG. 10 are similar to the semiconductor device in FIGS. 7-8B, and, therefore, a description in this regard will not be repeated hereinafter. It is noted that even though the semiconductor device of FIG. 1 is used as an example in FIG. 10, the second source pad 210 and the second drain pad 220 of FIG. 10 can be applied to any of the semiconductor devices mentioned above (such as the semiconductor devices of FIGS. 3, 4, and 6) according to actual requirements.

Figure 11:
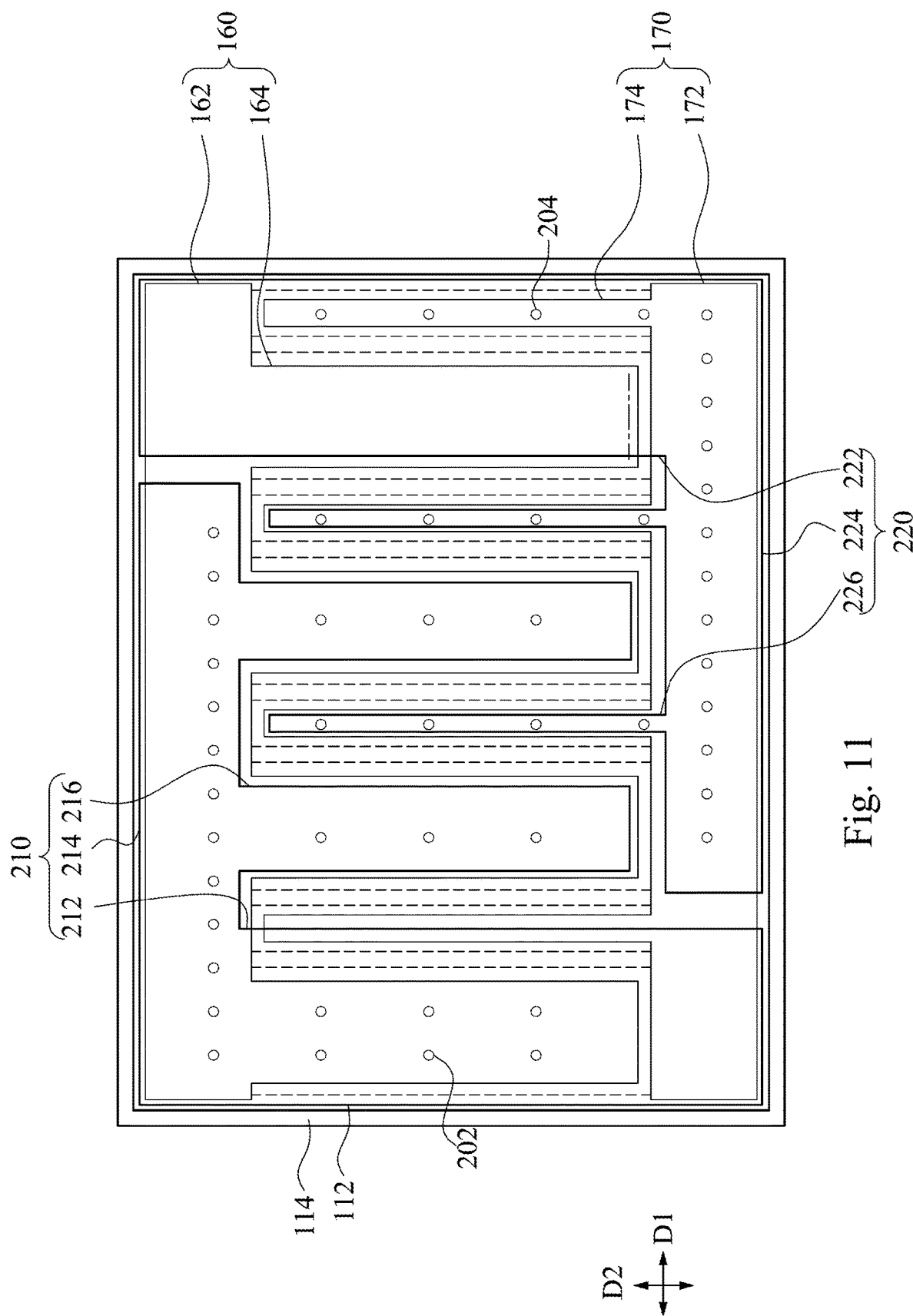
FIG. 11 is a top view of a semiconductor device according to another embodiment of the present disclosure.

FIG. 11 is a top view of a semiconductor device according to another embodiment of the present disclosure. The difference between the semiconductor devices in FIGS. 11 and 10 pertains to the configuration of the second source pad 210 and the second drain pad 220. In FIG. 11, the second source pad 210 further includes at least one third source branch 216. The third source branch 216 protrudes from the second source branch 214 and is disposed on the first source branch 164 of the first source pad 160. The third source branch 216 extends along the second direction D2.

In some embodiments, some of the vias 202 are disposed between the second source body 212 and the first source pad 160, some of the vias 202 are disposed between the second source branch 214 and the first source pad 160, and other vias 202 are disposed between the third source branch 216 and the first source branch 164 of the first source pad 160. Therefore, the resistance of source can be further reduced.

The second drain pad 220 further includes at least one third drain branch 226. The third drain branch 226 protrudes from the second drain branch 224 and is disposed on the first drain branch 174 of the first drain pad 170. The third drain branch 226 extends along the second direction D2.

In some embodiments, some of the vias 204 are disposed between the second drain body 222 and the first drain pad 170, some of the vias 204 are disposed between the second drain branch 224 and the first drain body 172 of the first drain pad 170, and other vias 204 are disposed between the third drain branch 226 and the first drain branch 174 of the first drain pad 170. Therefore, the resistance of drain can be further reduced. Other relevant structural details of the semiconductor device in FIG. 11 are similar to the semiconductor device in FIG. 10, and, therefore, a description in this regard will not be repeated hereinafter. It is noted that even though the semiconductor device of FIG. 1 is used as an example in FIG. 11, the second source pad 210 and the second drain pad 220 of FIG. 11 can be applied to any of the semiconductor devices mentioned above (such as the semiconductor devices of FIGS. 3, 4, and 6) according to actual requirements.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor device, comprising:
   an active layer having an active region;
   at least one source electrode and at least one drain electrode disposed on the active region of the active layer and arranged along a first direction;
   at least one gate electrode disposed on the active region of the active layer and between the source electrode and the drain electrode;
   a first insulating layer disposed on the source electrode, the drain electrode, and the gate electrode;
   at least one first source pad disposed on the first insulating layer and the active region of the active layer, and the first source pad comprising:
      a first source body disposed on the source electrode and the drain electrode and extending along the first direction; and
      at least one first source branch electrically connected to the first source body and disposed on the source electrode;
   at least one first drain pad disposed on the first insulating layer and the active region of the active layer, and the first drain pad comprising:
      a first drain body disposed on the source electrode and the drain electrode and extending along the first direction; and
      at least one first drain branch electrically connected to the first drain body and disposed on the drain electrode, wherein the first drain branch comprises a top drain branch and a bottom drain branch; and
   a second insulating layer disposed on the first insulating layer, wherein the first source branch is disposed between the first insulating layer and the second insulating layer, the first source body is disposed on the second insulating layer, the bottom drain branch is disposed between the first insulating layer and the second insulating layer, the top drain branch is disposed on the bottom drain branch and the second insulating layer, a space is formed between the source electrode and the first drain body of the first drain pad, and the first source branch and the first drain branch are entirely present outside the space.

2. The semiconductor device of claim 1, wherein a plurality of the first source branches are spatially separated from each other.

3. The semiconductor device of claim 1, wherein the first drain branch is disposed between the first insulating layer and the second insulating layer, and the first drain body is disposed on the second insulating layer.

4. The semiconductor device of claim 3, wherein a plurality of the first drain branches are spatially separated from each other.

5. The semiconductor device of claim 1, wherein a total thickness of the first insulating layer and the second insulating layer is greater than 4 µm.

6. The semiconductor device of claim 1, wherein a plurality of the first source pads are disposed on the first insulating layer and the active region of the active layer.

7. The semiconductor device of claim 6, wherein a plurality of the first drain pads are disposed on the first insulating layer and the active region of the active layer, and the first drain pads and the first source pads are alternately arranged along a second direction different from the first direction.

8. The semiconductor device of claim 1, wherein an orthogonal projection of the first source pad on the active layer forms a source pad region, an orthogonal projection of the drain electrode on the active layer forms a drain region, the source pad region overlaps at least a portion of the drain region, and an area of an overlapping region between the source pad region and the drain region being smaller than or equal to 40% of an area of the drain region.

9. The semiconductor device of claim 1, further comprising a third insulating layer disposed between the first insulating layer and the active layer, wherein the source electrode comprises:
   a bottom source portion disposed between the third insulating layer and the active layer; and
   a top source portion disposed between the first insulating layer and the third insulating layer, wherein the bottom source portion is electrically connected to the top source portion.

10. The semiconductor device of claim 9, wherein the drain electrode comprises:
    a bottom drain portion disposed between the third insulating layer and the active layer; and
    a top drain portion disposed between the first insulating layer and the third insulating layer, wherein the bottom drain portion is electrically connected to the top drain portion.

11. The semiconductor device of claim 1, further comprising:
    a fourth insulating layer disposed on the first source pad and the first drain pad;
    a second source pad disposed on the fourth insulating layer and electrically connected to the first source pad; and
    a second drain pad disposed on the fourth insulating layer and electrically connected to the first source pad.

12. The semiconductor device of claim 11, wherein the second source pad comprises:
    a second source body; and
    at least one second source branch protruding from the second source body and disposed on the first source body of the first source pad.

13. The semiconductor device of claim 12, wherein the second source pad further comprises:
    a third source branch protruding from the second source branch and disposed on the first source branch.

14. The semiconductor device of claim 13, further comprising:
    a via disposed between and electrically connected to the third source branch and the first source branch.

15. The semiconductor device of claim 1, further comprising:
    a fourth insulating layer disposed on the first source pad and the first drain pad;
    a plurality of second source pads disposed on the fourth insulating layer and electrically connected to the first source pad; and
    a plurality of second drain pads disposed on the fourth insulating layer and electrically connected to the first source pad, wherein the second source pads and the second drain pads are alternately arranged along the first direction.

16. The semiconductor device of claim 1, further comprising a gate layer disposed between the gate electrode and the active layer.

17. The semiconductor device of claim 16, further comprising a passivation layer disposed between the first insulating layer and the active layer, wherein at least a portion of the passivation layer is disposed between the gate electrode and the gate layer.

* * * * *